(12) United States Patent
Kato

(10) Patent No.: US 6,528,971 B2
(45) Date of Patent: Mar. 4, 2003

(54) INDICATING METHOD OF BATTERY LIFE AND ELECTRONIC DEVICE

(75) Inventor: Kazuo Kato, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/975,819

(22) Filed: Oct. 12, 2001

(65) Prior Publication Data

US 2002/0060553 A1 May 23, 2002

(51) Int. Cl.7 .............................................. H01M 10/46
(52) U.S. Cl. .......................................... 320/132; 368/66
(58) Field of Search ................................ 320/107, 114, 320/115, 127, 128, 132, 135, 149, DIG. 21; 324/433, 435; 340/635, 636; 368/62, 66, 203, 204

(56) References Cited

U.S. PATENT DOCUMENTS 3,991,553 A * 11/1976 Bergey et al.
4,316,274 A * 2/1982 Ushikoshi
4,396,889 A * 8/1983 Arai
4,730,287 A * 3/1988 Yoshino et al.
5,136,246 A * 8/1992 Sakamoto

* cited by examiner

Primary Examiner—Edward H. Tso
(74) Attorney, Agent, or Firm—Adams & Wilks

(57) ABSTRACT

To easily adjust an indication reference of a battery life. A CPU generates a maximum voltage value necessary for the operations of all functions of an electronic watch as a reference voltage of an analog quantity, inputs the voltage value to an A/D converting circuit to convert it into a digital value, stores the digital value outputted from the A/D converting circuit as a reference value corresponding to a voltage value necessary for each processing mode of the electronic watch into an EEPROM, converts the voltage value as an analog quantity of a battery into a digital value, and compares the digital value with the foregoing reference value to determine and indicate the battery life.

6 Claims, 9 Drawing Sheets

INDICATING METHOD OF BATTERY LIFE AND ELECTRONIC DEVICE

BACKGROUND OF THE INVENTION

1. Field of the Invention

The present invention relates to a method for indicating battery life and a computer readable recording medium and, more particularly, to a method for indicating battery life of an electronic device typified by an electronic watch having an exclusive-use microcomputer IC therein, the method being capable of adjusting an indication reference of the battery life so that a voltage necessary for the operations of all functions can be determined.

2. Description of the Prior Art

In recent years, electronic watches have many functions. For example, wristwatches each having watch auxiliary functions such as alarm, chronograph, timer, and the like, an altimeter function, and the like separately from watch functions have been manufactured. Since the altimeter function measures an altitude on the basis of a change in atmospheric pressure by detecting the atmospheric pressure through a pressure sensor, it requires a voltage higher than that of the general watch function or watch auxiliary function.

On the other hand, in electronic devices such as electronic watches or the like to which a power supply is supplied by a battery, has been known a method for indicating battery life in such a manner that the battery life is determined on the basis of a voltage of the battery and is displayed. According to the indicating method, a comparator built in an exclusive-use microcomputer IC for controlling the watch functions of the electronic watch detects the battery voltage, compares the voltage with a preset reference voltage, determines the battery life, and indicates the life.

There have been known electronic devices for displaying the indication. For example, there have been known electronic devices, in which a character modeled on a dry battery is divided into three portions, for indicating that an enough voltage is stored when all of the divided portions are displayed, and sequentially turning off the display portions as the voltage is reduced, thereby indicating battery life.

In the conventional method for indicating battery life, however, since the comparator built in the exclusive-use microcomputer IC determines the battery life to indicate it, only voltages within a restricted range according to the detection resolving power of the comparator can be determined.

The conventional method for indicating battery life is designed so as to set a low voltage necessary for the watch function or watch auxiliary function as a reference. Accordingly, in a case of the altimeter function requiring a voltage higher than that for the watch function or watch auxiliary function, in spite of such a display that the battery life is not exhausted, it is not a necessary voltage in some cases. In this case, when the altimeter function is executed, the function may not be normally operated or the battery may run down during the execution of the altimeter function.

That is, the detection resolving power of the comparator built in the exclusive-use microcomputer IC is generally equal to ±0.1[V]. Even when it is varied depending on software or the like, a value which can be set as a reference value is limited to 2.4[V], 1.8[V], 1.2[V], or 1.05[V]. For instance, when a detection voltage is set to 2.4[V], an actual detection voltage is in a range from 2.3 to 2.5 [V], namely, a detection range of 0.2[V]. The value can be set only within a range according to mass production variation. Accordingly, in the case of the function such as watch function or watch auxiliary function which can use even the low voltage, when the detection resolving power of the comparator is equal to ±0.1[V], enough battery life can be maintained. However, in the electronic watch with heavy loads, for example, with the altimeter function accompanied with atmospheric pressure detection through a pressure sensor, the low limit value (about 2.4[V]) of the operation voltage of the function is higher than that (about 1.1[V]) of the general function of the electronic watch. Therefore, the function is not normally operated or battery exhaustion occurs.

SUMMARY OF THE INVENTION

The present invention is made in consideration of the above problems and it is an object of the invention to provide a versatile method for indicating battery life of an electronic device typified by an electronic watch having an exclusive-use microcomputer IC therein, the method being capable of easily adjusting an indication reference of the battery life according to a function so as not to cause such a situation that the function is not normally operated or battery exhaustion occurs.

To accomplish the above object, according to the invention, a method for indicating battery life comprises: an indication reference adjusting mode step including a reference voltage converting step of generating a minimum driving voltage value necessary for the operations of all functions of an electronic device as a reference voltage of an analog quantity and of inputting the voltage value into an A/D converting circuit to convert the value into a digital value, and a reference value storing step of storing a digital value outputted from the A/D converting circuit as a reference value corresponding to a voltage value necessary for each processing mode of the electronic device; a battery life indicating mode step including a battery voltage converting step of inputting the voltage value of a battery as an analog quantity to the A/D converting circuit to convert the value into a digital value, a reference value reading step of reading out the reference value previously stored, a comparing step of comparing the digital value outputted from the A/D converting circuit with the reference value, and a battery life determination indicating step of determining battery life necessary for the operations of all functions on the basis of the comparison result to indicate the battery life; and a mode switching control step of controlling to switch the mode between the indication reference adjusting mode and the battery life indicating mode.

Consequently, the indication reference of the battery life can be adjusted according to all functions of the electronic device typified by an electronic watch, which has an exclusive-use microcomputer IC therein. Therefore, according to the invention, since the reference voltage according to the function can be easily set, a versatile method for indicating battery life can be provided. Consequently, the function can be normally operated and the occurrence of battery exhaustion can be prevented during the operation of the function. The indication reference can be adjusted without needing a high speed adjusting device for controlling the A/D converting circuit or writing data to an EEPROM on a circuit block.

Preferably, the mode switching control step includes a synchronization signal switching step of switching the mode to the indication reference adjusting mode on the basis of a synchronization signal from an adjusting device, the adjusting device comprising: a stabilized power supply for generating an arbitrary voltage value as an analog quantity as a reference voltage and for outputting the voltage to the A/D converting circuit; and control means for outputting the generated reference voltage and for outputting the synchronization signal. The synchronization signal switching step may include a reset input switching step of, when a reset input is supplied to the electronic device in addition to the synchronization signal, switching the mode to the indication reference adjusting mode.

Further, an electronic device according to the invention is characterized by using the above-mentioned method for indicating battery life.

A computer readable recording medium of the invention may be characterized by storing a program which allows a computer to execute the foregoing method for indicating battery life.

The "computer readable recording medium" means a portable medium such as floppy disk, magneto-optical disk, ROM, CD-ROM, or the like, and a recording device such as hard disk or the like, which is installed in a computer system. Furthermore, the "computer readable recording medium" includes a medium such as a communication line for transmitting a program through a network such as the Internet or the like or a communication line such as a telephone line or the like, which dynamically holds a program for a short time, and also includes a medium such as a volatile memory in a computer system serving as a server or a client in this case, which holds a program for a predetermined period. The above program may realize a moiety of the above-mentioned functions and may realize the foregoing function by combining with a program previously stored in the computer system.

As the foregoing A/D converting circuit, for example, an A/D converting circuit for sensor detection, which converts an output of a pressure sensor for measuring a pressure into a digital value at the time of an altimeter function, as disclosed in Japanese Patent Application Laid-Open No. 9-318403/1997 is preferably used.

BRIEF DESCRIPTION OF THE SEVERAL VIEWS OF THE DRAWINGS

A preferred form of the present invention is illustrated in the accompanying drawings in which.

DETAILED DESCRIPTION OF THE PREFERRED EMBODIMENTS

The invention will now be described in detail hereinbelow with reference to the drawings. The invention is not restricted by the following embodiments.

(Embodiment 1)

Figure 1:
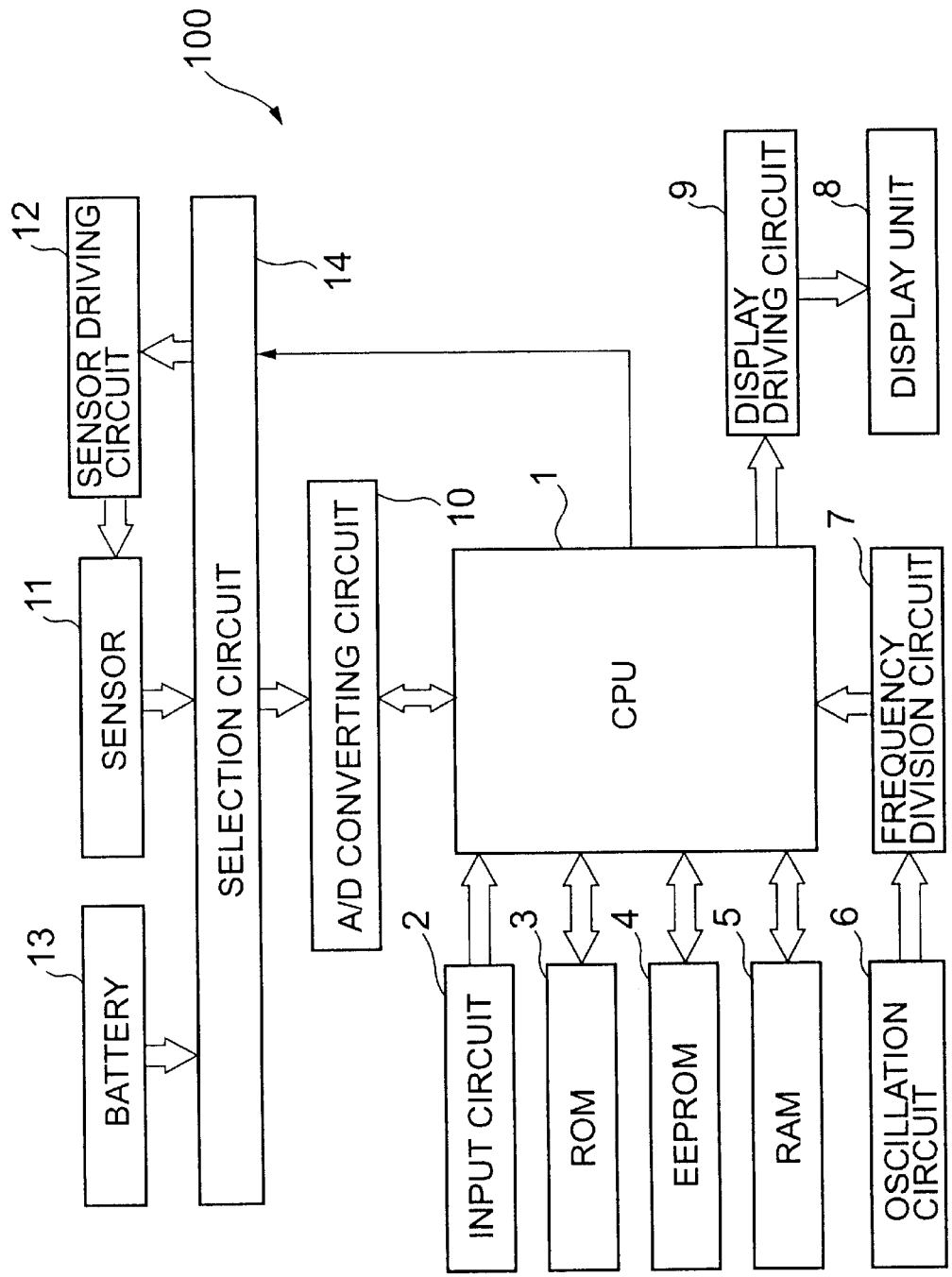
FIG. 1 is a block diagram showing the hardware of an electronic watch used for the invention.

FIG. 1 is a block diagram showing the hardware of an electronic watch used for the invention. An electronic watch 100 mainly comprises: a CPU 1; an input circuit 2; an ROM 3; an EEPROM 4; an RAM 5; an oscillation circuit 6; a frequency division circuit 7; a display unit 8; a display driving circuit 9; an A/D converting circuit 10; a sensor 11; a sensor driving circuit 12; a battery 13; and a selection circuit 14.

The CPU 1 performs processing for the entire electronic watch 100 including a mode switching control step of controlling mode switching between an indication reference adjusting mode step and a battery life indicating mode step.

The indication reference adjusting mode step is processing including: a reference voltage converting step of generating a minimum driving voltage value necessary for the operations of all functions of the electronic watch 100 as a reference voltage of an analog quantity and of inputting the voltage value to the A/D converting circuit to convert the value into a digital value; and a reference value storing step of storing a digital value outputted from the A/D converting circuit 10 as a reference value corresponding to a voltage value necessary for each processing mode of the electronic watch 100.

The battery life indicating mode step is processing including: a battery voltage converting step of inputting a voltage value as an analog quantity of a battery into the A/D converting circuit 10 to convert the value into a digital value; a reference value reading step of reading out the reference value previously stored; a comparing step of comparing the digital value outputted from the A/D converting circuit 10 with the reference value; and a battery life determination indicating step of determining the battery life necessary for the operations of all functions on the basis of the comparison result to indicate the battery life.

The input circuit 2 inputs a synchronization signal from an adjusting device, which will be described later. The ROM 3 is a non-volatile storage medium which stores various programs and various fixed data. The EEPROM 4 is a non-volatile storage medium which stores the reference value outputted from the A/D converting circuit 10, which will be described later. The reference value is shown as AD_BLI2. An intermediate between a supposed maximum voltage of the battery and the reference value AD_BLI2 is shown as an intermediate value AD_BLI1. The RAM 5 is rewritable storage medium which stores variables and the like of various programs.

The oscillation circuit 6 and the frequency division circuit 7 generate clocks to realize watch functions. The display unit 8 is a display element such as an LCD or an LED, which displays data such as time and the like. The display driving circuit 9 controls the display to the display unit 8. The A/D converting circuit 10 converts a voltage value as an analog quantity into a digital value. The sensor 11 is, for example, a pressure sensor which outputs detection voltage corresponding to an atmospheric pressure. The sensor driving circuit 12 is, for example, a constant-current power supply which drives the sensor 11. The battery 13 is a power supply of the electronic watch 100. By the control of the CPU 1, the selection circuit 14 selects any one of the voltage of the battery, output voltage of the sensor, or reference voltage outputted from a stabilized power supply, which will be explained later, as an analog quantity to be inputted to the A/D converting circuit 10.

Figure 2:
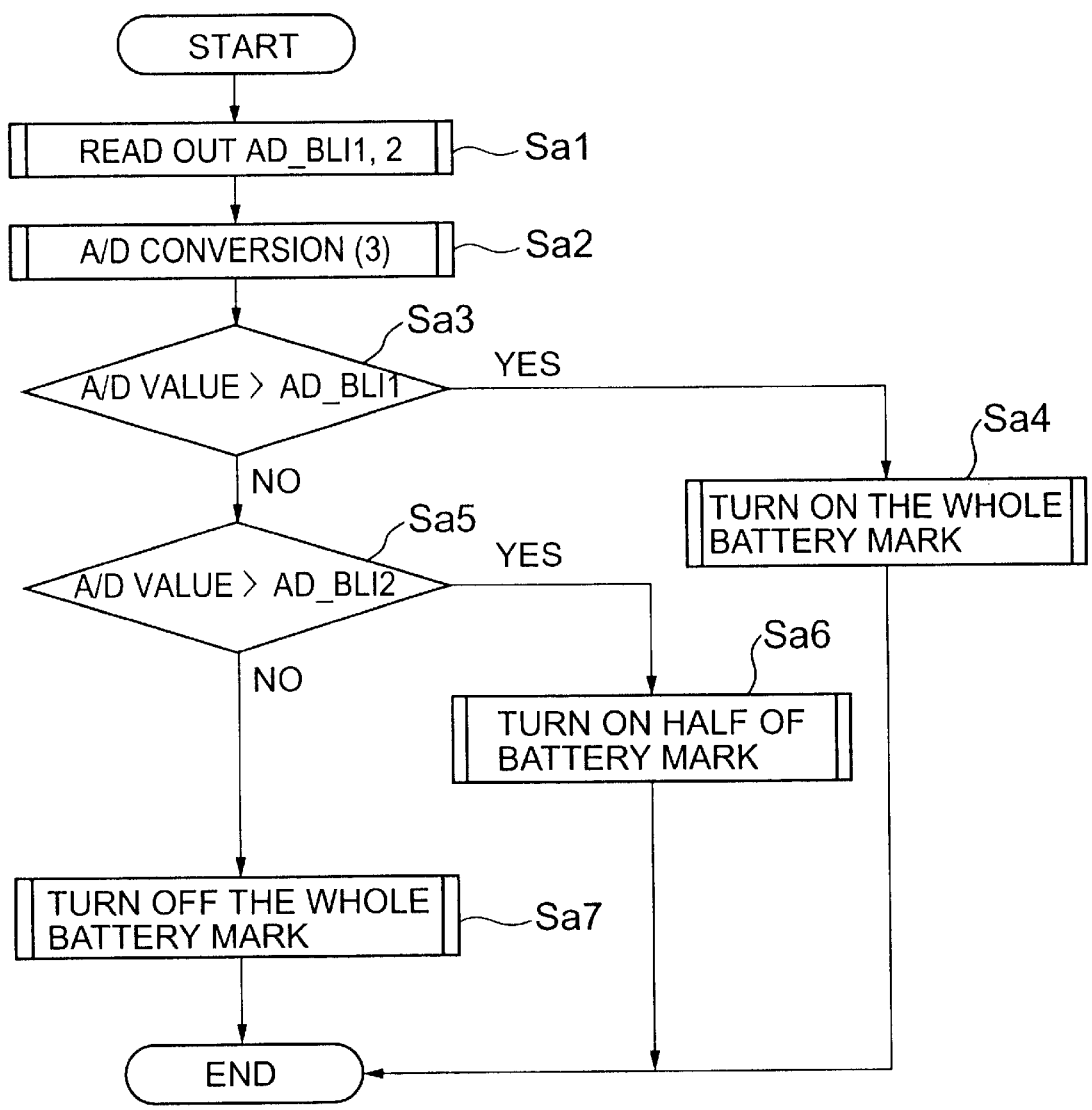
FIG. 2 is a flowchart for explaining battery life determining processing of the electronic watch shown in FIG. 1.

First, the battery life determining processing of the electronic watch shown in FIG. 1 will now be explained. FIG. 2 is a flowchart for explaining the battery life determining processing of the electron watch shown in FIG. 1. The CPU 1 reads out the reference value AD_BLI2 and the intermediate value AD_BLI1 stored in the EEPROM 4 in the battery life indicating mode (step Sa1). The CPU 1 generates an instruction for the selection circuit 14 to input the voltage of the battery 13 to the A/D converting circuit 10 to allow the A/D converting circuit 10 to convert the voltage of the battery 13 into a digital value (step Sa2).

Subsequently, the CPU 1 first compares the intermediate value AD_BLI1 with the digital value (hereinbelow, referred to as an "A/D value"). When the A/D value is larger (Yes in step Sa3), a battery mark is turned on as a whole and the present processing is finished (step Sa4). On the other hand, when the A/D value is smaller (No in step Sa3), the CPU 1 compares the reference value AD_BLI2 with the A/D value. When the A/D value is larger (Yes in step Sa5), the half of the battery mark is turned on and the present processing is finished (step Sa6) When the A/D value is smaller (No in step Sa5), the battery mark is turned off as a whole and the present processing is finished (step Sa7). That is, according to the above battery life determining processing, it is possible to inform the user of even the turn-off of the whole battery mark as a minimum voltage value of the battery life.

Figure 3:
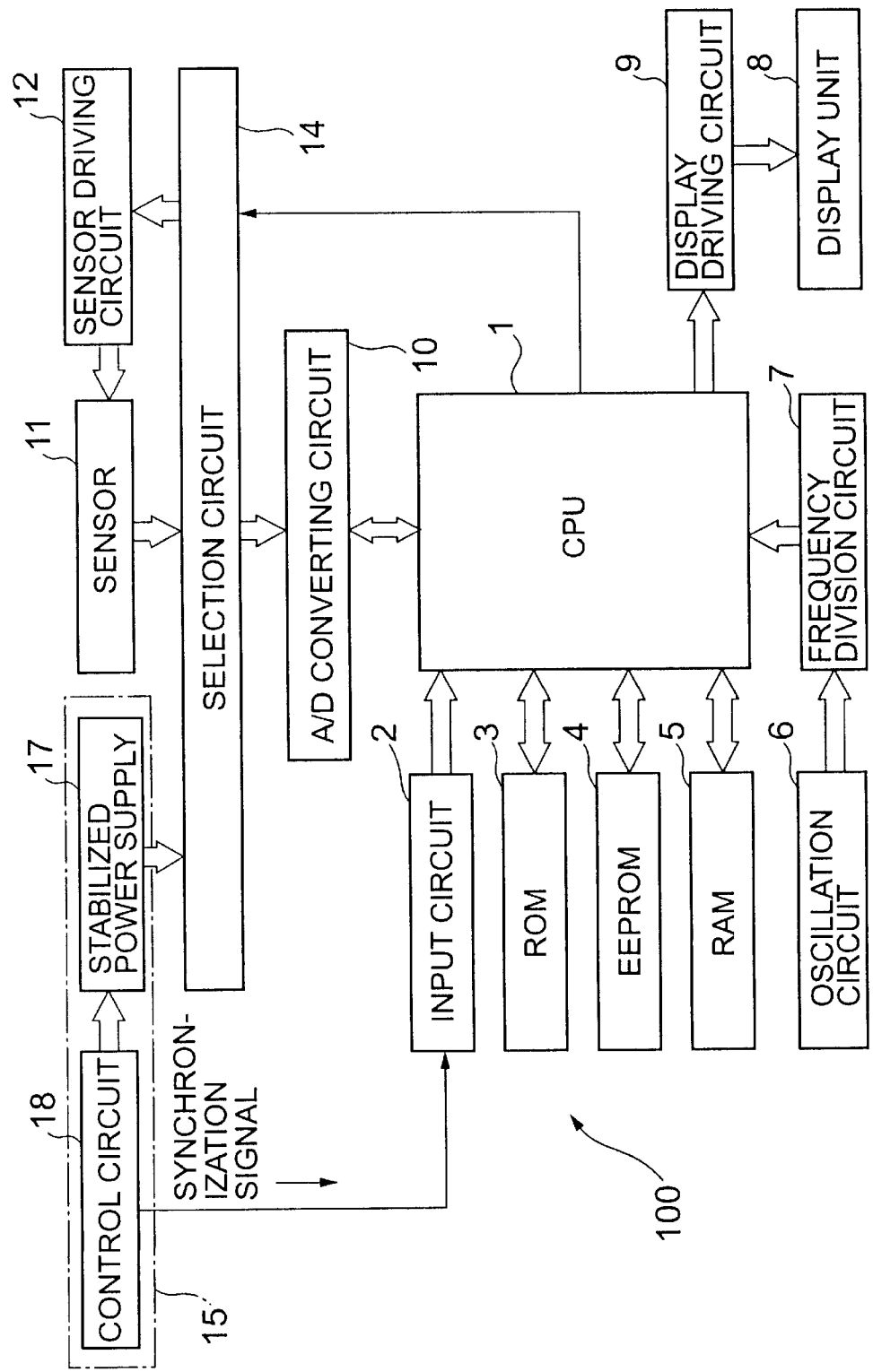
FIG. 3 is a block diagram showing hardware to realize reference voltage adjusting processing of the battery life determining processing according to the embodiment 1 of the invention.
Figure 4:
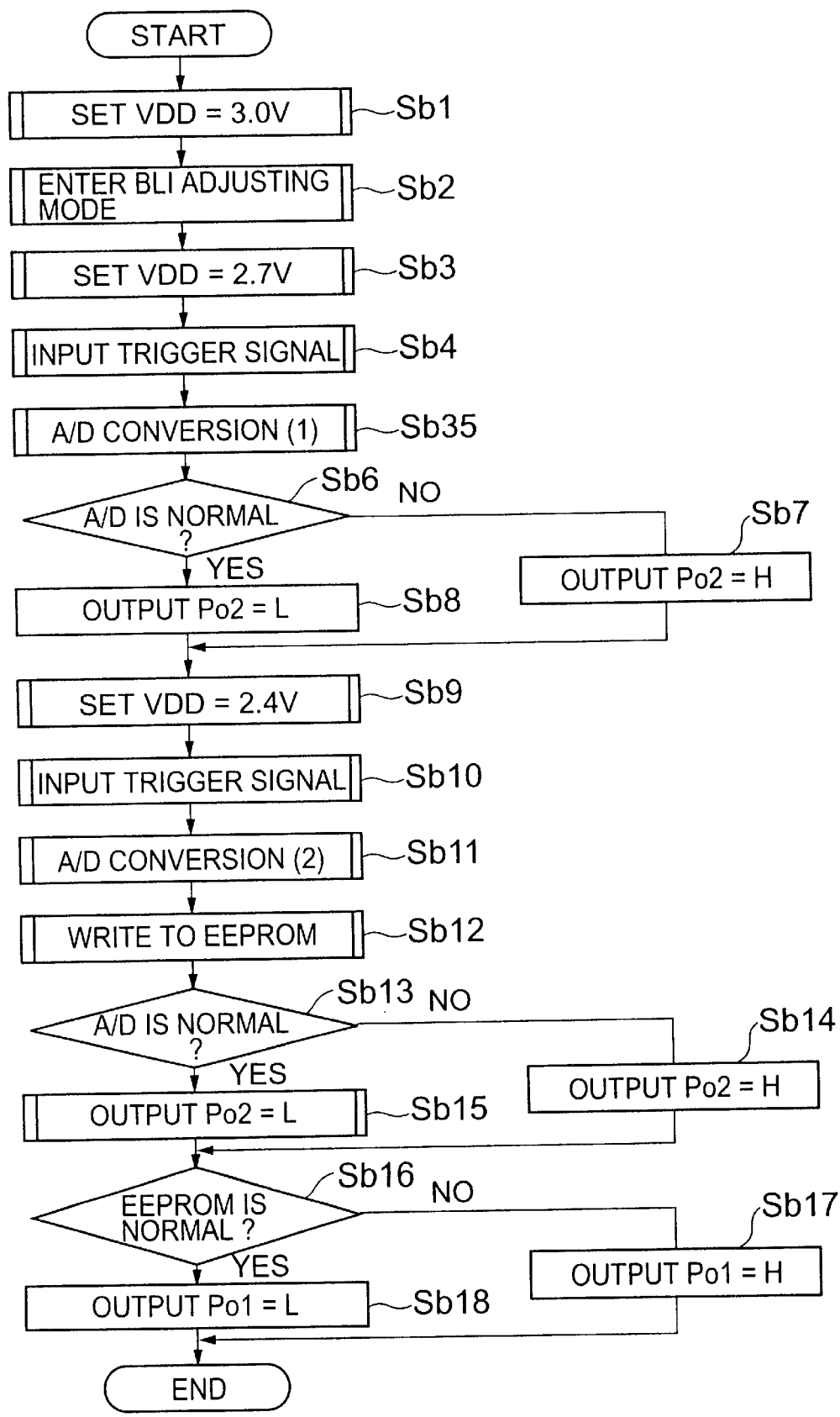
FIG. 4 is a flowchart for explaining the reference voltage adjusting processing according to the embodiment 1 of the invention.
Figure 5:
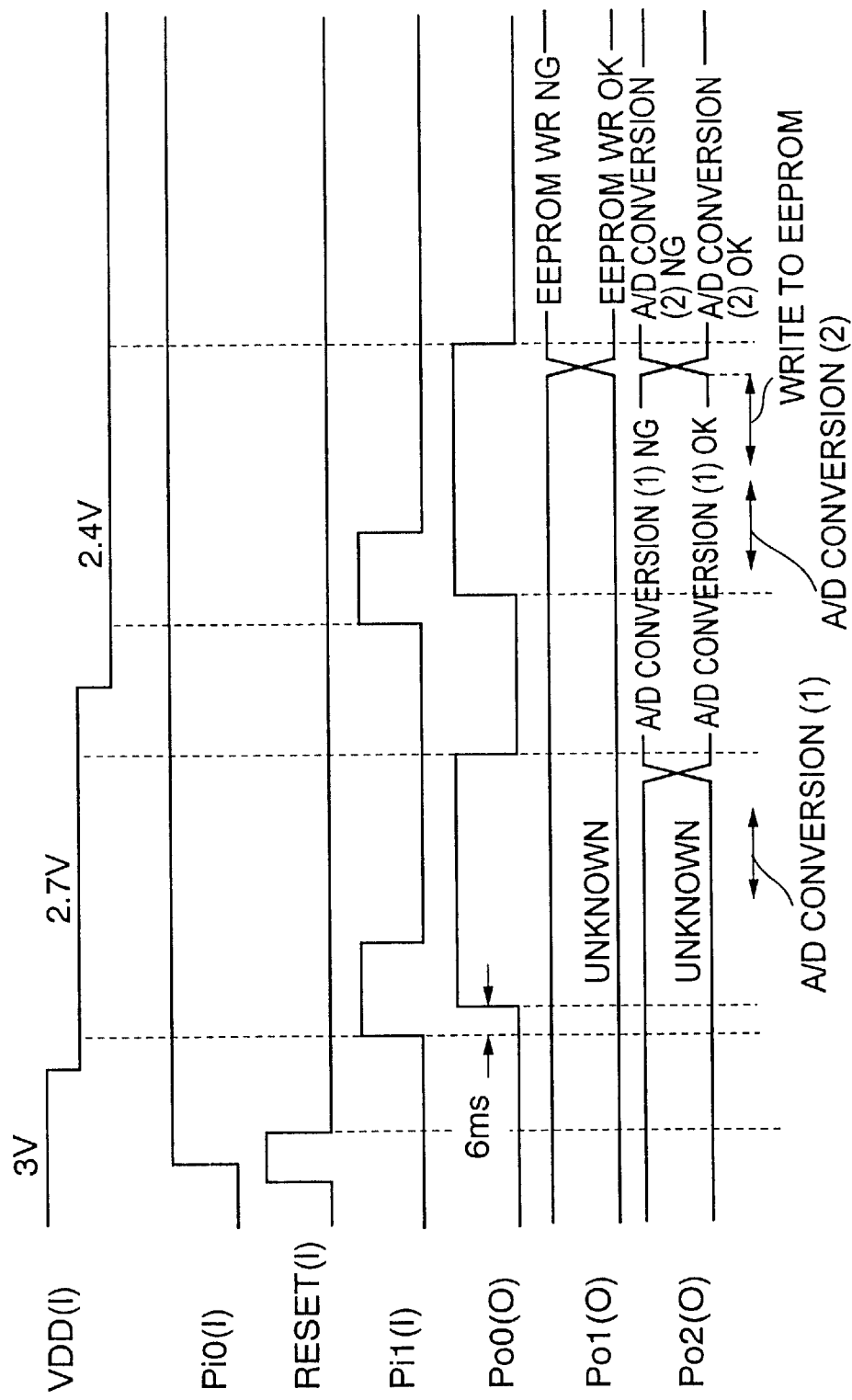
FIG. 5 is a timing chart for explaining the reference voltage adjusting processing according to the embodiment 1 of the invention.

Subsequently, the reference voltage adjusting processing will now be described. FIG. 3 is a block diagram for explaining the reference voltage adjusting processing according to the embodiment 1 of the invention. The battery 13 in FIG. 1 is replaced with an adjusting device 15. FIG. 4 is a flowchart for explaining the reference voltage adjusting processing according to the embodiment 1 of the invention. FIG. 5 is a timing chart for explaining the reference voltage adjusting processing according to the embodiment 1. In FIG. 5, a voltage VDD formed by a stabilized power supply 17, signals Pi0, RESET, and Pi1 as synchronization signals outputted from a control circuit 18, and signals Po0, Po1, and Po2 as signals outputted from the electronic watch 100 are shown in the order from the top. As analog voltages generated by the stabilized power supply 17, a case where three kinds of voltages of 3[V], 2.7[V] (AD_BLI1), AND 2.4[V] (AD_BLI2) are set as voltages used as references for adjustment will now be explained. Setting the analog voltage is not limited to them. The voltage can be properly set according to the design.

When VDD of 3[V] from the stabilized power supply 13 is applied (step Sb1) to input the synchronization signals Pi0 and RESET, the CPU 1 first switches the mode to the indication reference adjusting mode (hereinbelow, referred to as a "BLI adjusting mode") to start the execution (step Sb2). It takes only standby time (125 msec) until software starts the operation after reset release. For such a period, a voltage of the stabilized power supply 13 is decreased to 2.7[V] and the CPU 1 enters the BLI adjusting mode under conditions where Pi0 is inputted upon reset release.

Next, the CPU 1 monitors at intervals of 6 msec to detect the input of Pi1 at a high level H, and outputs the output of Po0 at a high level H as a busy signal to the control circuit 18 (step Sb4). Subsequently, the CPU 1 sets Po0 to a high level H and then performs preprocessing for executing the A/D conversion. The preprocessing is processing for reading out a command indicative of which pattern signal is transmitted to the A/D converting circuit 10 from the ROM 3 or a program which is being executed and for outputting the signal as a control signal to the A/D converting circuit 10. The foregoing pattern signal is a control signal for allowing the selection circuit 14 to select, for example, the functions (measuring function for measuring the power supply voltage and measuring function for measuring the sensor) of the A/D converting circuit.

Then, the A/D converting circuit 10 executes the A/D conversion (1) (step Sb5) and outputs the converted digital value to the CPU 1. The CPU 1 determines whether the A/D conversion has been normally performed. When the A/D converting operation is abnormal, the CPU 1 outputs Po2 at a high level H (step Sb6, No: step Sb7). When it is normal, the CPU 1 outputs it at a low level L (step Sb6, Yes: step Sb8). To show the end of the first A/D converting operation, the CPU 1 outputs Po0 at a low level L.

Subsequently, after the control circuit 18 confirms that Po0 is at a low level L, the stabilized power supply 17 decreases the output voltage VDD to 2.4[V] (step Sb9). When Pi1 is reset from a low level L to a high level H, the CPU 1 monitors at intervals of 6 msec to detect the input of Pi1 at a high level H, and outputs the output of Po0 at a high level H as a busy signal to the control circuit 18 (step Sb10). Subsequently, the CPU 1 sets Po0 to a high level H and, after that, performs preprocessing for executing the A/D conversion. The A/D converting circuit 10 executes A/D conversion (2) (step Sb11) and outputs the converted digital value to the CPU 1.

The CPU 1 writes the two digital values (A/D values) to the EEPROM 4 (step Sb12). The CPU 1 determines whether the A/D conversion has been normally performed. When the A/D converting operation is abnormal, the CPU 1 outputs Po2 at a high level H (step Sb13, No: step Sb14). When it is normal, the CPU 1 outputs it at a low level L (step Sb13, Yes: step Sb15).

Furthermore, the CPU 1 determines whether the storage to the EEPROM 4 has been normally performed. When the operation is abnormal, the CPU 1 outputs Po1 at a high level H (step Sb16, No: step Sb17). When it is normal, the CPU 1 outputs it at a low level L (step Sb16, Yes: step Sb18). The CPU 1 finally outputs Po0 at a low level L to show the end of the second operation, thereby finishing the operation.

Figure 6:
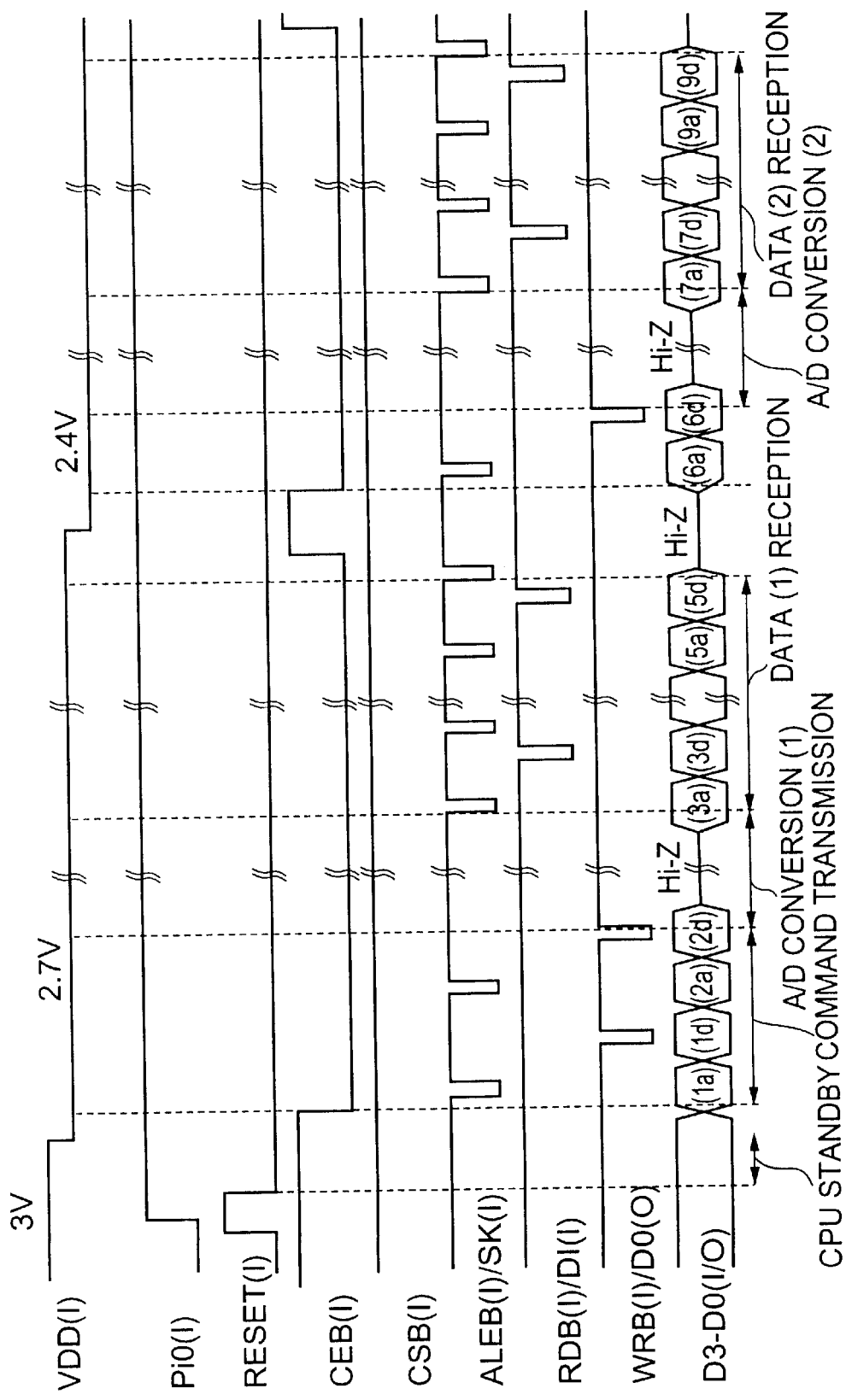
FIG. 6 is a further detailed timing chart for explaining the reference voltage adjusting processing according to the embodiment 1 of the invention.
Figure 7:
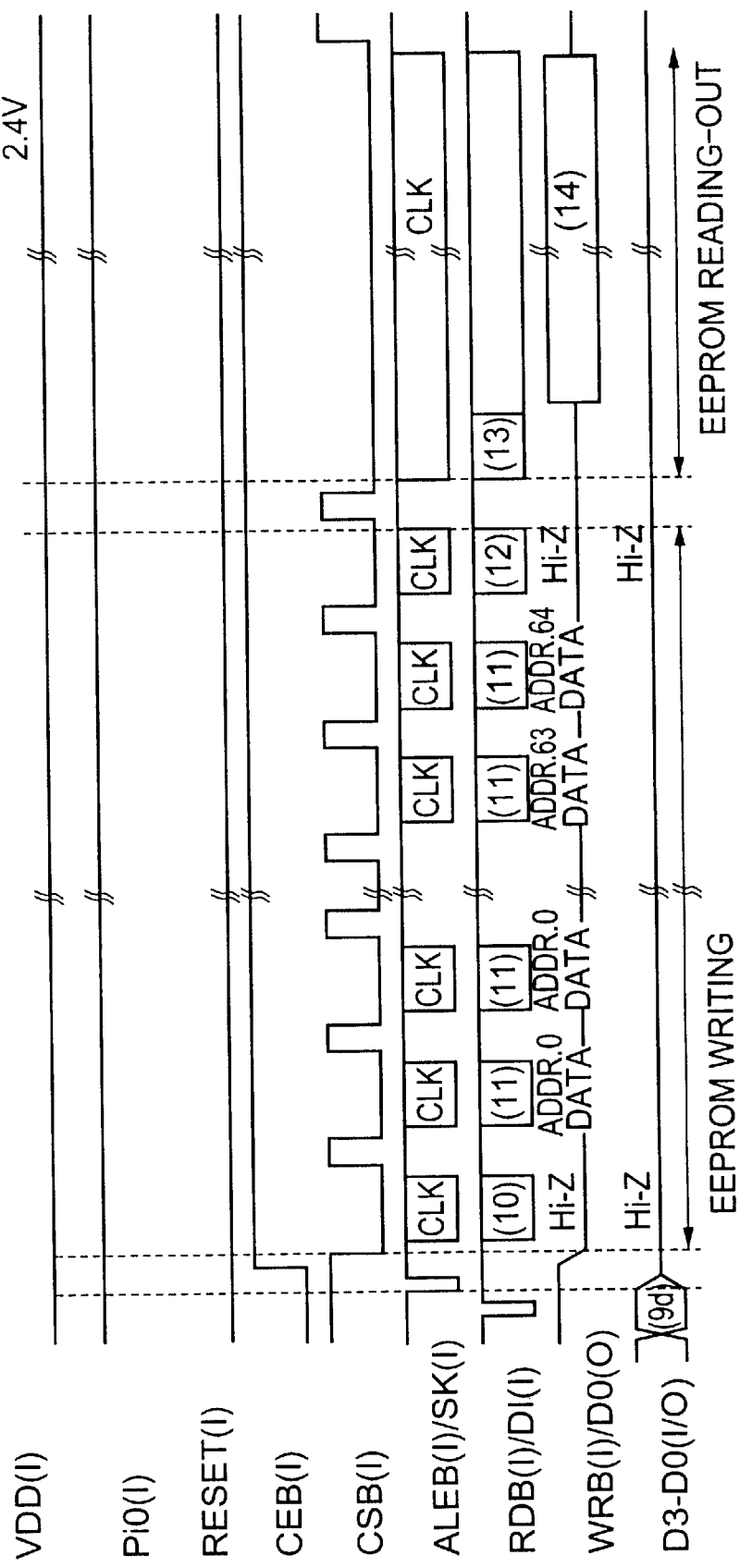
FIG. 7 is a further detailed flowchart for explaining reference voltage adjusting processing according to an embodiment 1 of the invention.

FIGS. 6 and 7 are further detailed timing charts for explaining the reference voltage adjusting processing according to the embodiment 1 of the invention. In FIGS. 6 and 7, the voltage VDD generated by the stabilized power supply 17, signals Pi0, RESET, CEB (enable signal of the A/D converting circuit 10), CSB (enable signal of the EEPROM 4), ALEB (address latch signal of the A/D converting circuit 10)/SK (serial clock signal of the EEPROM 4), RDB (data read-out control signal of the A/D converting circuit 10)/DI (serial input signal of the EEPROM 4), WRB (data writing control signal of the A/D converting circuit 10)/DO (serial output signal of the EEPROM 4), and D3–D0 (address/data bus signal of the A/D converting circuit 10) are shown in the order from the top. "/" denotes that one signal line has a plurality of functions and the function of the signal line is switched to another one on the basis of the values of the control signals CEB and CSB. As D3–D0, addresses (1a) to (9a) are outputted synchronously with the falling edge of ALEB/SK and data (1d) to (9d) are outputted synchronously with the falling edge of WRB/DO.

As shown in the timing charts, after the start of the BLI adjusting mode, the CPU 1 transmits operation frequency selection (1d) and input signal selection (2d) to the A/D converting circuit 10 and the selection circuit 14. When receiving this (2d), the selection circuit 14 selects the battery as an A/D conversion input signal. The A/D converting circuit 10 starts the A/D conversion. Subsequently, the CPU 1 receives the data (3d) to (5d) of the A/D conversion (1). Similarly, input signal selection (6d) is transmitted and the data (6d) to (9d) of the A/D conversion (2) are received.

After the A/D converting operation, the CPU 1 always sets CEB to a high level H. Subsequently, the CPU 1 sets CBS from a high level H to a low level L, thereby setting the EEPROM 4 to an enable state. After that, the CPU 1 repeats the operation for setting CEB to a low level L→a high level H→a low level L. For such a period of the low level L, the wiring operation to the EEPROM 4 ((10) to (11) in FIG. 7) is performed. Finally, the CPU 1 outputs a write prohibition command ((12) in FIG. 7), thereby finishing the writing operation. After that, the CPU 1 generates a command ((13) in FIG. 7) for reading out from the EEPROM 4, reads out written data ((14) in FIG. 7), and compares the preceding write data with the read-out data, thereby determining whether the writing operation has been precisely performed to the EEPROM 4. As for the reading operation from the EEPROM 4, for example, data sequences of 16 bits of the addresses 0 to 64 are continuously outputted. In the wiring operation to the EEPROM 4, the outputs of WRB/DO and D3–D0 are set to a high impedance state (Hi-Z). In the reading operation from the EEPROM, the output of D3–D0 is set to the high impedance state (Hi-Z).

According to the above embodiment 1, there is obtained an advantage in that the indication reference of the battery life can be adjusted in accordance with all functions of the electronic device typified by an electronic watch having an exclusive-use microcomputer IC therein. Accordingly, since the voltage according to the function can be easily set, the versatile method for indicating the battery life can be provided. Advantages in that the function is normally operated and the occurrence of battery exhaustion can be prevented during the operation of the function can be expected. Consequently, a high speed adjusting device for controlling the A/D converting circuit on the circuit block and for writing data into the EEPROM is not needed and the indication reference can be adjusted by using a versatile adjusting device, so that the adjustment can be performed with high precision at low costs.

(Embodiment 2)

Figure 8:
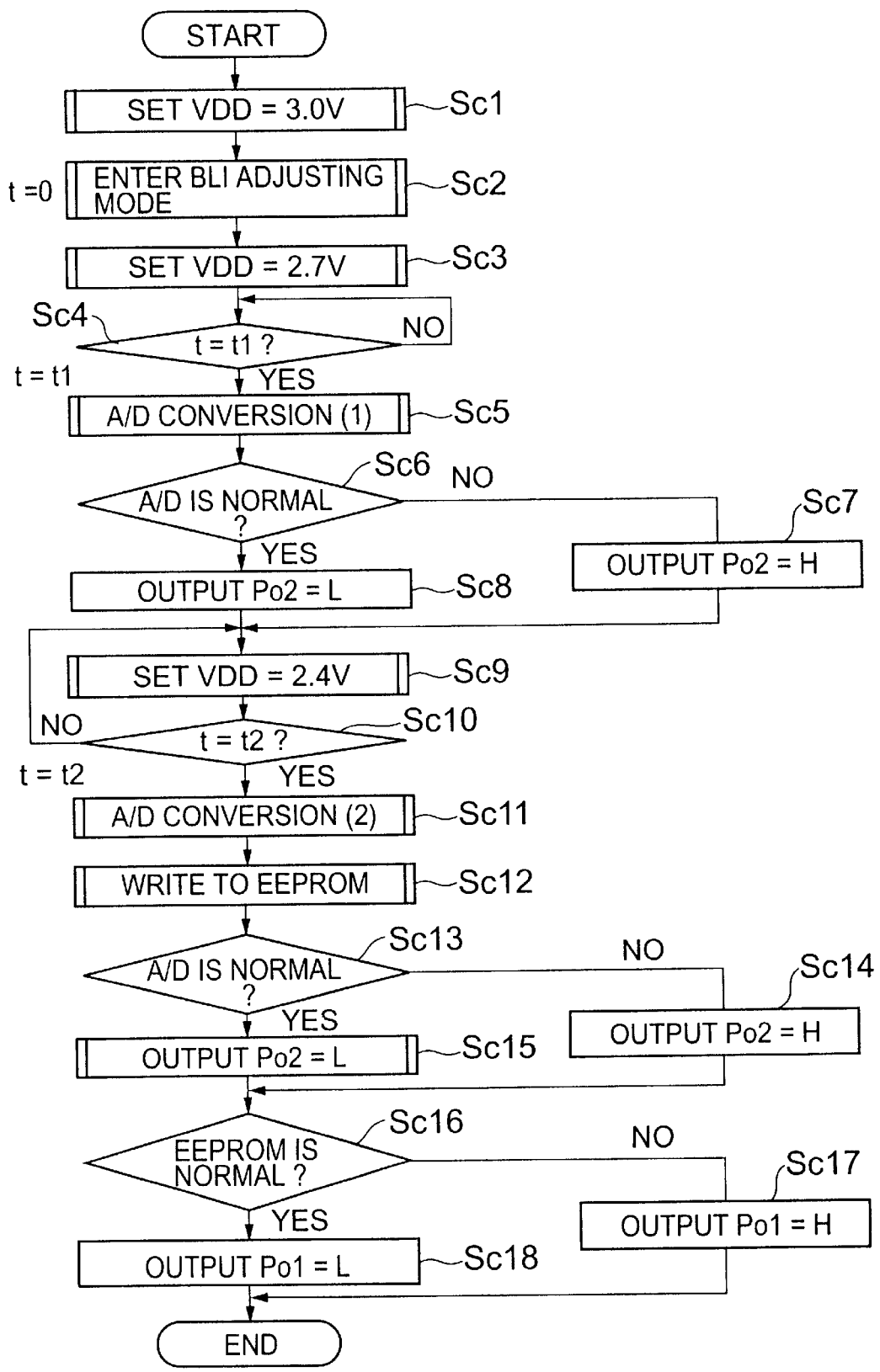
FIG. 8 is a flowchart for explaining the reference voltage adjusting processing according to the embodiment 2 of the invention.
Figure 9:
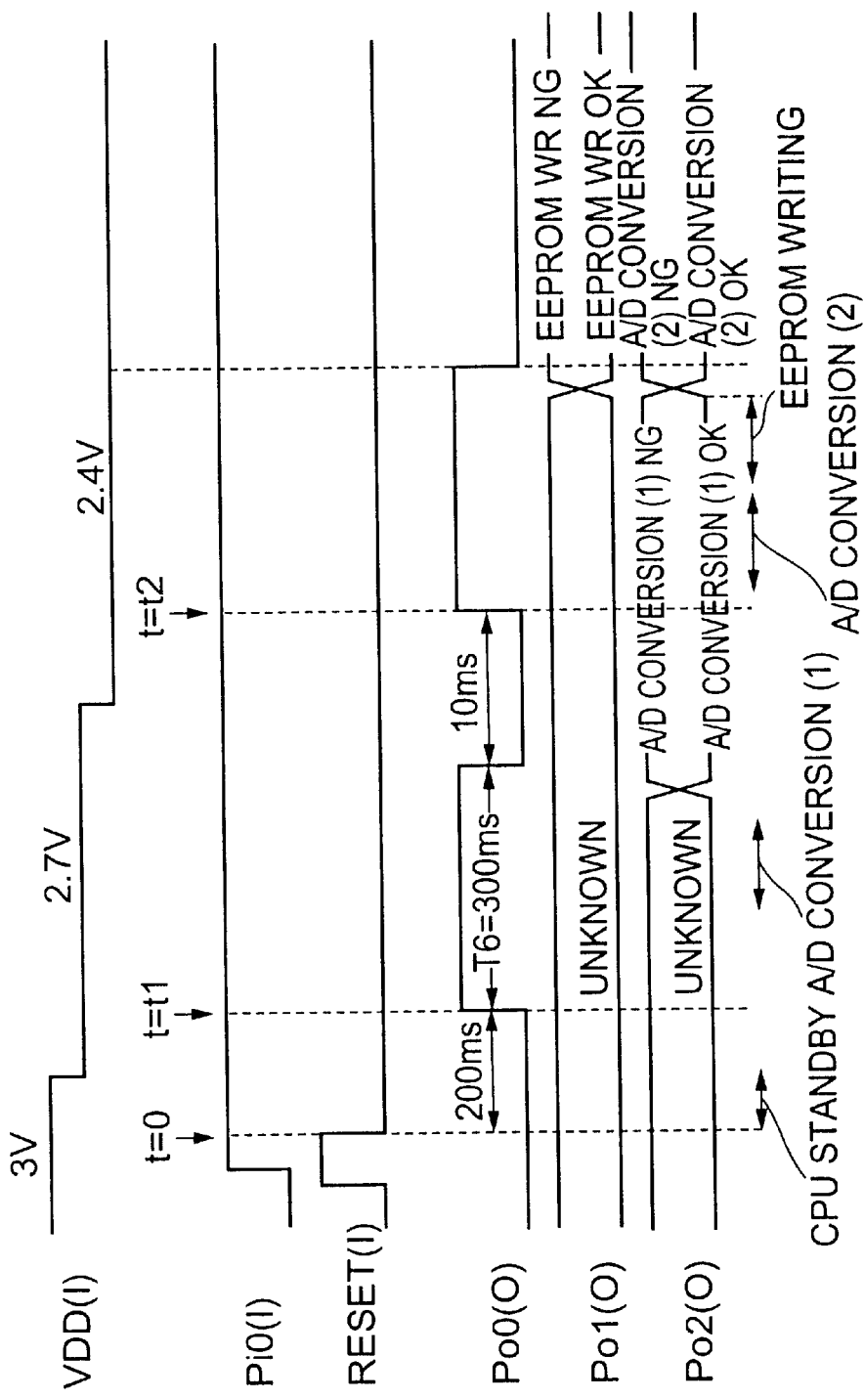
FIG. 9 is a timing chart for explaining the reference voltage adjusting processing according to the embodiment 2 of the invention.

It differs from the above-mentioned embodiment 1 with respect to the synchronization signals upon switching the mode. The differences will now be described hereinbelow. The block configuration (FIG. 3) explained in the above embodiment 1 is the same as that of the embodiment 2. FIG. 8 is a flowchart for explaining reference voltage adjusting processing according to the embodiment 2 of the invention. FIG. 9 is a timing chart for explaining the reference voltage adjusting processing according to the embodiment 2 of the invention.

FIG. 9 shows the voltage VDD formed by the stabilized power supply 17, signals Pi0 and RESET as synchronization signals outputted from the control circuit 18, and signals Po0, Po1, and Po2 as signals for measurement in the order from the top. Therefore, it differs from the above embodiment 1 with respect to such a point that there is no Pi1 as a synchronization signal. Similar to the above embodiment 1, the case where three kinds of voltages such as 3[V], 2.7[V] (AD_BLI1), 2.4[V] (AD_BLI2) are set as analog voltages formed by the stabilized power supply 17 will be explained.

When VDD of 3[V] from the stabilized power supply 13 is applied (step Sc1) to input the synchronization signals Pi0 and RESET, the CPU 1 first switches the mode to the indication reference adjusting mode (hereinbelow, referred to as a "BLI adjusting mode") to start execution (step Sc2). It requires only standby time (125 msec) until the software starts the operation after reset release. In the embodiment 2, after the elapse of time t1 (200 ms) including the standby time (125 msec) until the software starts the operation after the reset release, the CPU 1 enters the BLI adjusting mode under conditions where Pi0 is inputted upon reset release (step Sc4).

Next, the CPU 1 sets Po0 to a high level H and then performs preprocessing for executing the A/D conversion. Then, the A/D converting circuit 10 executes the A/D conversion (1) (step Sc5) and outputs the converted digital value to the CPU 1. The CPU 1 determines whether the A/D conversion has been normally performed. When the A/D converting operation is abnormal, the CPU 1 outputs Po2 at a high level H (step Sc6, No: step Sc7). When it is normal, the CPU 1 outputs it at a low level L (step Sc6, Yes: step Sc8).

Subsequently, the control circuit 18 allows the stabilized power supply 17 to decrease the output voltage VDD to 2.4[V] (step Sc9). The CPU 1 sets Po0 to a high level H at time t2 after the elapse of time (10 ms) after the falling of Po0. After that, the CPU 1 performs preprocessing for executing the A/D conversion (step Sc10). The A/D converting circuit 10 executes the A/D conversion (2) (step Sc11) and outputs the converted digital value to the CPU 1.

The CPU 1 writes the two digital values (A/D values) to the EEPROM 4 (step Sc12). The CPU 1 determines whether the A/D conversion has been normally performed. When the A/D converting operation is abnormal, the CPU 1 outputs Po2 at a high level H (step Sc13, No: step Sc14). When it is normal, the CPU 1 outputs it at a low level L (step Sc13, Yes: step Sc15).

Furthermore, the CPU 1 determines whether the storage to the EEPROM 4 has been normally performed. When the operation is abnormal, the CPU 1 outputs Po1 at a high level H (step Sc16, No: step Sc17). When it is normal, the CPU 1 outputs it at a low level L (step Sc16, Yes: step Sc18). The CPU 1 finally outputs Po0 at a low level L to show the end of the second operation, thereby finishing the operation.

According to the embodiment 2, in addition to the advantages of the above embodiment 1, since the synchronization signals can be reduced by one as compared with the above embodiment 2, the number of wires between the adjusting device and the electronic watch can be reduced as compared with that of the above embodiment 1.

As mentioned above, according to the invention, the advantages in that the indication reference of the battery life can be adjusted in accordance with each function of the electronic device typified by an electronic watch having the exclusive-use microcomputer IC therein can be obtained. According to the invention, therefore, since the voltage according to the function can be easily set, it is possible to provide a versatile method for indicating the battery life. Advantages in that the functions can be normally operated and the occurrence of battery exhaustion can be prevented during the operation of the function can be expected. Consequently, a high speed adjusting device for controlling the A/D converting circuit on the circuit block and for writing data into the EEPROM is not needed and the indication reference can be adjusted by using a versatile adjusting device, so that the adjustment can be performed with high precision at low costs.

What is claimed is:

1. A method for indicating battery life, comprising:

an indication reference adjusting mode step for converting a minimum driving voltage value into a digital value and storing the digital value;

a battery life indicating mode step for comparing the digital value with a reference value to indicate a result if necessary; and a mode switching control step for switching a mode between the indication reference adjusting mode and the battery life indicating mode.

2. The method for indicating battery life according to claim 1, wherein the indication reference adjusting mode step comprises:

a reference voltage converting step for generating the minimum driving voltage value necessary for the operations of all functions of an electronic device as a reference voltage of an analog quantity and inputting the voltage value into an A/D converting circuit to convert the value into a digital value; and a reference value storing step for storing a digital value outputted from the A/D converting circuit as a reference value corresponding to a voltage value necessary for each processing mode of the electronic device.

3. The method for indicating battery life according to claim 1, wherein the battery life indicating mode step comprises:

a battery voltage converting step for inputting the voltage value of a battery as an analog quantity to the A/D converting circuit to convert the value into a digital value;

a reference value reading step for reading out the reference value previously stored;

a comparing step for comparing the digital value outputted from the A/D converting circuit with the reference value; and a battery life determination indicating step for determining battery life necessary for performing the operations of all functions of an electronic device on the basis for the comparison result to indicate the battery life.

4. The method for indicating battery life according to any one of claim 1, wherein the mode switching control step includes a synchronization signal switching step for switching the mode to the indication reference adjusting mode on the basis of a synchronization signal from an adjusting device, the adjusting device comprising: a stabilized power supply for generating an arbitrary voltage value as an analog quantity as a reference voltage and for outputting the voltage to the A/D converting circuit; and control means for outputting the generated reference voltage and for outputting the synchronization signal.

5. The method for indicating battery life according to claim 4, wherein the synchronization signal switching step includes a reset input switching step of, when a reset input is supplied to the electronic device in addition to the synchronization signal, switching the mode to the indication reference adjusting mode.

6. An electronic device using a method according to claim 1.

* * * * *